US010680724B2

(12) United States Patent
Laughlin

(10) Patent No.: US 10,680,724 B2
(45) Date of Patent: Jun. 9, 2020

(54) METHODS AND APPARATUS FOR DUPLEXING SIGNALS

(71) Applicant: u-blox AG, Thalwil (CH)

(72) Inventor: Leo Laughlin, Bristol (GB)

(73) Assignee: u-blox AG, Thalwil (CH)

( * ) Notice: Subject to any disclaimer, the term of this patent is extended or adjusted under 35 U.S.C. 154(b) by 0 days.

(21) Appl. No.: 16/262,812

(22) Filed: Jan. 30, 2019

(65) Prior Publication Data

US 2019/0238239 A1 Aug. 1, 2019

(30) Foreign Application Priority Data

Jan. 31, 2018 (EP) .................................... 18154556

(51) Int. Cl.
| | |
|---|---|
| *H04W 24/02* | (2009.01) |
| *H04L 5/14* | (2006.01) |
| *H04B 17/29* | (2015.01) |
| *H04B 17/24* | (2015.01) |
| *H04B 17/21* | (2015.01) |

(Continued)

(52) U.S. Cl.
CPC ........... *H04B 17/11* (2015.01); *H04B 17/101* (2015.01); *H04B 17/15* (2015.01); *H04B 17/21* (2015.01); *H04B 17/24* (2015.01); *H04B 17/29* (2015.01); *H04L 5/14* (2013.01); *H04L 5/1461* (2013.01);

(Continued)

(58) Field of Classification Search
CPC ........ H03H 7/002–54; H04B 1/40–588; H04B 17/0082–409; H04L 5/0001–26; H04W 24/02–10; H04W 52/02–60
See application file for complete search history.

(56) References Cited

U.S. PATENT DOCUMENTS

| 2015/0222412 A1* | 8/2015 | Laughlin | ................ H04B 1/581 |
| 2017/0033454 A1* | 2/2017 | van Bezooijen | ......... H01Q 1/50 |

FOREIGN PATENT DOCUMENTS

| EP | 2 903 170 A1 | 8/2015 |
| EP | 3 185 426 A1 | 6/2017 |

OTHER PUBLICATIONS

Laughlin, et al., "Passive and Active Electrical Balance Duplexers"; IEEE Transactions or Circuits and Systems—II: Express Briefs, vol. XX. No. XX, Dec. 2015 (5 pgs.).

(Continued)

*Primary Examiner* — Timothy J Weidner
(74) *Attorney, Agent, or Firm* — Finnegan, Henderson, Farabow, Garrett & Dunner LLP

(57) ABSTRACT

A duplexing apparatus comprises a reference of impedance settings and corresponding calibration measurements. A controller is arranged to set a variable impedance to a first impedance setting and transmit a first transmit signal at a first transmit frequency and measure a resulting first signal at an output node of a hybrid circuit. The controller then selects a second impedance setting, transmits a second transmit signal at a second transmit frequency and measures a resulting second signal at the output node. The controller then determines a balancing result using a system of equations associating the first and second measured signals, and first and second calibration measurements from the reference in respect of the first and second impedance settings, respectively. A third impedance setting is retrieved from the reference by reference to the balancing result to provide isolation of an input node from the output node of the hybrid circuit.

20 Claims, 7 Drawing Sheets

(51) Int. Cl.
- *H04B 17/15* (2015.01)
- *H04B 17/11* (2015.01)
- *H04B 17/10* (2015.01)
- *H04B 1/58* (2006.01)
- *H04B 1/525* (2015.01)
- *H03H 7/46* (2006.01)

(52) U.S. Cl.
CPC ............ H04W 24/02 (2013.01); *H03H 7/463* (2013.01); *H04B 1/525* (2013.01); *H04B 1/582* (2013.01)

(56) References Cited

OTHER PUBLICATIONS

Extended European Search Report pursuant to Rule 62 EPC, the European Search Report (R. 61 EPC) or the partial European search report/declaration of no search (R. 63 EPC) and the European Search Opinion (9 pgs.).

* cited by examiner

METHODS AND APPARATUS FOR DUPLEXING SIGNALS

CROSS REFERENCE TO RELATED APPLICATION

This application claims priority to European patent application No. EP 18154556-7, filed on Jan. 31, 2018, which is incorporated herein by reference in its entirety.

TECHNICAL FIELD

The present invention relates to an apparatus for duplexing signals of the type that, for example, uses a system of equations to determine a balancing impedance setting for a hybrid junction. The present invention also relates to a wireless device of the type that, for example, uses a system of equations to determine a balancing impedance setting for a hybrid junction. The present invention further relates to a method of duplexing signals, the method being of the type that, for example, uses a system of equations to determine a balancing impedance setting for a hybrid junction.

BACKGROUND

In some wireless communications systems, such systems comprise a network infrastructure and user equipment, which can for example be portable communications devices. Such communications devices typically receive and transmit signals through the same antenna or set of antennas. This means that some form of duplexing scheme is required in order to allow the device to separate the incoming and outgoing signals such that the former is not swamped by the latter. In this respect, Time-Division Duplexing (TDD) and Frequency-Division Duplexing (FDD) are both well-known duplexing schemes.

Availability of radio spectrum in which to operate the communications system is known to be a limiting factor. So-called 4G, or Long Term Evolution (LTE), is the successor to existing 2G and 3G communications systems. Indeed, LTE-compliant networks are already in operation in many countries. For historical reasons, there are 60 LTE operating frequency bands for the LTE standard as defined in the 3G Partnership Project (3GPP) Rel 15 of the LTE standard, of which 35 require FDD operation. More bands are likely to be defined in later releases of the LTE standard as further mobile broadband spectrum is made available by governments in various territories.

In FDD radio operation, there are two separate carriers at different frequencies, one for the uplink transmission and one for the downlink transmission. Isolation between the downlink and the uplink transmissions is usually achieved by transmission/reception filters called diplexing filters (duplexers or diplexers). These filters are typically implemented as two highly selective filters, one centred on a receive frequency band, the other centred on the transmit frequency band to separate the transmit and receive signals, thereby preventing the transmit signal from interfering with the receive signal. Acoustic resonator filters, such as Surface Acoustic Wave (SAW) filters, are typically used to provide the low insertion loss and sharp roll-off required of duplexing filters. Although these are individually small and cheap, a communications device that is to support multiple frequency bands requires one diplexing filter per frequency band to be supported and further Radio Frequency (RF) switching for selection between the frequency bands so that the duplexing filters can share the antenna.

Furthermore, these filters cannot be integrated with a CMOS circuit owing to the high-Q resonators used to build SAW filters and so they must be implemented off-chip. This is not usually problematic for a simple radio transceiver operating on a single frequency band. However, modern radio transceivers are usually multi-band. As mentioned above, the LTE standard currently specifies 35 FDD frequency bands. To support all of the specified frequency bands would require a manufacturer of user equipment to use multiple filters due to the need for one diplex filter per frequency band supported. A bank of discrete duplexers is one known approach, the bank being connected to an antenna, transmitter and receiver via a multi-way RF switch, which selects the appropriate duplexer based upon a required frequency band of operation. Such an approach increases the complexity of the user equipment, as well as increasing the overall size and cost of the multi-band transceiver. This approach can also lead to performance penalties; for example, the introduction of the RF switch can result in power losses as multiple frequency bands are supported.

Many device manufacturers simply circumvent this problem by designing and manufacturing differently configured devices supporting different sets of frequency bands of operation. Manufacturers thus provide a range of devices each of which is operable in different groups of territories with different frequency band combinations. It can therefore be appreciated that obviating the need for the above-described filters would remove a barrier to the manufacture of a "world phone", the benefits of which would provide economies of scale to the mobile telephony industry, and mitigate an inconvenience for the international traveller.

Therefore, there is a significant market demand for a solution that is able to replace the fixed tuned diplexer with a flexible device that can support multiple, preferably all, frequency bands.

Although it is possible to tune diplexing filters making up a diplexer, such an approach is currently technically impractical because very high Q-factor resonators are required to achieve the desired selectivity and low power loss. Currently, in order to achieve the small filter size required, such resonators are only realisable as acoustic resonators, which have a well-known bi-resonant characteristic that limits their electrical tuning to only a small frequency range.

An alternative duplexing solution is the use of so-called hybrid junctions or hybrid circuits. This is a 4-port network that can separate the forward and reverse wave directions in a transmission line. Hybrid junctions can be made in a number of ways, including using transformers, waveguides ("magic tees"), or microstrip ("directional couplers"). Hybrid junctions can also be made using active circuits, as is the case for modern electronic analogue wireline phones.

The hybrid junction typically comprises a first (transmit) port, a second (antenna) port, a third (receive) port and a fourth (balance) port. In operation of an ideal hybrid junction, all power incident at the transmit port is divided between the antenna port and the balance port. Likewise, all power incident upon the receive port is divided between the antenna port and the balance port. The device is therefore lossless and reciprocal, and has two symmetry planes with similar properties around each.

Broadband hybrids can be made using transformers, and single-transformer circuits, for example as described in "A Multiband RF Antenna Duplexer on CMOS: Design and Performance" (M. Mikhemar, H. Darabi, and A. A. Abidi, IEEE Journal of Solid-State Circuits, vol. 48, pp. 2067-2077, 2013).

A theoretical hybrid junction, when used as a duplexer, has a power amplifier of a transmitter chain coupled to the transmit port thereof and a low-noise amplifier coupled to the receive port. Transmit power applied at the transmit port by the power amplifier is, as described above, divided between the antenna port and the balance port and the low-noise amplifier is isolated, i.e. there is no leakage of a transmit signal into the receiver as long as the reflection coefficients at the antenna port and the balance port are in balance.

In practice, however, use of the hybrid junction as a duplexer suffers from a number of drawbacks. Firstly, the impedance of the antenna, and so by extension the impedance at the antenna port, typically exhibits variation in both the time domain and frequency domain. The impedance of the antenna can vary with time, for example owing to objects moving in the proximity of the antenna, and consequently, it is necessary to adapt dynamically the impedance at the balance port to the impedance at the antenna port to account for these changes. The antenna impedance also typically varies with frequency and so, to obtain balance at the particular frequency of interest, the impedance at the balance port must be adapted accordingly, and a good balance may be difficult to achieve over a sufficiently wide system bandwidth, for example the 20 MHz needed for an LTE channel. Furthermore, increasing the isolation bandwidth, i.e. the bandwidth over which adequate isolation can be achieved, requires increases in the complexity of the variable balancing impedance circuit, which will increase the size and cost of the device.

Secondly, other coupling mechanisms cause leakage of some of the transmit signal from the transmit port to the receive port of the hybrid junction. As such, isolation of the receive port from the transmit port is limited.

A further technical disincentive to use of the hybrid junction as a duplexer is the absorption of power required to achieve the impedance balance. In this respect, hybrid junctions are typically symmetrical, as mentioned above, with an equal 3 dB loss in each branch of the hybrid junction. Thus, in the context of duplexing, half the transmit power is "wasted" and 3 dB is effectively added to the noise figure by virtue of the waste of received power impacting the signal-to-noise ratio (SNR) of the received signal.

Despite the above-mentioned drawbacks associated with use of the hybrid junction as a duplexer, attempts have been made to obviate or at least mitigate the disadvantages. For example, "Optimum Single Antenna Full Duplex Using Hybrid Junctions" (Laughlin, Beach, Morris and Haine, IEEE Journal of Selected Areas In Communications, Vol. 32, No. 9, September 2014, pages 1653 to 1661), considers an arbitrary antenna with an impedance that can vary widely with frequency and with a return loss that is likely to be of the order of 10 dB minimum (as long as there are no de-tuning proximity effects). This is a practical reality for a transceiver circuit that can be built into a wide range of end products and could possibly be connected through an unknown length of transmission line. So-called Electrical Balance (EB) of the hybrid junction is proposed in the above-referenced document.

However, in FDD systems, including LTE, isolation is required concurrently in both the uplink and downlink bands, meaning that EB duplexers must be simultaneously balanced in both of these bands, which may be separated by more than 100 MHz. This requires either a very wide isolation bandwidth in order to cover both bands, or the EB hybrid junction has to possess a "dual notch" balancing characteristic as was demonstrated in "Tunable CMOS Integrated Duplexer with Antenna Impedance Tracking and High Isolation in the Transmit and Receive Bands" (Abdelhalem, Gudem and Larson, IEEE Transactions on Microwave Theory and Techniques, Vol. 62, no. 9, pp. 2092-2104, September 2014.). Both of these techniques can increase the complexity of the tunable balancing impedance circuit, which may require several or more tunable circuit elements to provide adequate balancing.

For any tunable balancing impedance design, a method and/or apparatus which adjusts the tunable circuit in order to balance the EB duplexer in the required frequency band or bands is required. This is commonly referred to as a balancing algorithm.

European patent publication no. EP-A1-2 903 170 discloses an apparatus for duplexing signals that employs a balancing algorithm. The balancing algorithm is based upon characterisation of, and solution to, a linear equation that describes the transmit-to-receive transfer function of the EB hybrid junction duplexer. A pair of simultaneous equations having two unknowns is disclosed, which can be solved algebraically to yield an expression (a balancing equation) relating a balancing reflection coefficient to a pair of transmit-receive gain measurements made in respect of a respective pair of known balancing reflection coefficients. The balancing algorithm is based upon the balancing equation.

However, the balancing equation described above relies upon knowledge of balancing reflection coefficient values. In particular, the balancing coefficient values need to be set accurately in hardware when the corresponding transmit-receive gains are measured. By way of further explanation, the variable impedance that constitutes the balancing impedance is digitally (or otherwise) set via a control input thereof. In this regard, it has been discovered that a variation exists between the desired setting applied to the control input of the variable impedance, which are, for example, the intended impedance values that are known only from the design of the variable impedance, and actual impedance values achieved, which may differ from the intended design values due to, for example, imperfections in the manufacturing process. When employing the balancing algorithm described above, the isolation achieved between transmit and receive ports of the hybrid junction is suboptimal owing to this difference between the desired impedance and the actual impedance achieved when setting the variable impedance using the digital control. There exists, therefore, a requirement for systems that can balance the duplexer using a similar balancing algorithm, but which is not sensitive to manufacturing imperfections.

SUMMARY

According to a first aspect of the present invention, there is provided an apparatus for duplexing signals to be transmitted and received wirelessly by an antenna, the apparatus comprising: a hybrid circuit comprising an antenna node for coupling to the antenna, an input node for receiving a signal to be transmitted wirelessly by the antenna, an output node for outputting a signal received wirelessly by the antenna, and a balancing node; a variable impedance operably coupled to the balancing node, the variable impedance comprising a control input to select an impedance setting of the variable impedance; a data store comprising a reference of impedance settings and corresponding calibration measurements in respect of a consistent impedance applied to the antenna node of the hybrid circuit, the impedance settings corresponding to impedances; and a controller arranged to: set the variable impedance to a first impedance setting; transmit a first transmit signal at a first transmit frequency in a first frequency band; measure a first signal at the output node at a first receive frequency in a second frequency band as a result of the first signal transmitted at the first transmit frequency; select a second impedance setting; transmit a second transmit signal at a second transmit frequency in the first frequency band; measure a second signal at the output node at a second receive frequency in the second frequency band as a result of the second signal transmitted at the second transmit frequency; employ a system of equations comprising variables associating the first measured signal, the second measured signal, a first calibration measurement from the record of associations in respect of the first impedance setting, and a second calibration measurement from the record of associations in respect of the second impedance setting; determine a balancing result using the system of equations; retrieve a third impedance setting from the record of associations by reference to the balancing result, the third impedance setting providing isolation of the input node from the output node of the hybrid circuit.

The apparatus may be arranged to retrieve the first calibration measurement from the record of associations in respect of the first impedance setting and the second calibration measurement from the record of associations in respect of the second impedance setting.

The reference of impedance settings and corresponding calibration measurements may be a record of associations between a plurality of impedance settings and a plurality of respective calibration measurements in respect of the consistent impedance applied to the antenna node; the plurality of impedance settings may correspond to a plurality of impedances, respectively.

The control input of the variable impedance may be continuously variable.

The reference may comprise an equation recording the relationship between the calibration measurements and the impedance settings.

The control input of the variable impedance may be discrete.

The controller may be further arranged to: vary the impedance value using the control input to provide the plurality of impedance settings and to generate a record of associations between the plurality of impedance settings and a plurality of respective calibration measurements.

The control input of the variable impedance may comprise a set of selectable settings; the plurality of impedance settings may respectively correspond to a number of the set of possible settings of the variable impedance.

The plurality of impedance settings may respectively correspond to the set of selectable settings of the variable impedance.

The number of the set of selectable settings of the variable impedance may be a subset of the set of selectable settings of the variable impedance.

The subset of the set of selectable settings of the variable impedance may comprise between about 100 and about 1000 variable impedance setting of the selectable settings of the variable impedance.

The first frequency band and the second frequency band may not overlap, overlap partially or overlap completely.

The first transmit frequency and the first receive frequency may be identical or different.

The controller may be further arranged to: for each measurement of the first and second signals, calculate respective quantities representing a first measured gain and a second measured gain; access the data store and retrieve the first calibration measurement and the second calibration measurement from the record of associations by reference to the first and second impedance settings, respectively; and control the variable impedance as a function of the respective quantities and the retrieved first and second transmit-receive gains.

The controller may be configured to carry out operations periodically to determine the third impedance setting.

The controller may be arranged to evaluate:

$$\frac{G_1(\omega, X_1)(C(\omega, X_1) - C(\omega, X_2))}{G_2(\omega, X_2) - G_1(\omega, X_1)} + C(\omega, X_1),$$

to obtain the third balancing result, where: $G_1$ may be a first measured transmit-receive gain, $G_2$ may be a second measured transmit-receive gain, $C$ may be the calibration measurement, $X_1$ may be the first impedance setting, $X_2$ may be the second impedance setting, and $\omega$ may be frequency.

The system of equations employed may comprise variables associating the first measured signal, the second measured signal, the first impedance setting, the second impedance setting, the first transmitted signal, the second transmitted signal, a first calibration measurement and a second calibration measurement.

The data store may store the record of associations as a lookup table.

The system of equations may model a transmit-receive gain variable as a function of a calibration measurement variable that can be related to the impedance setting of the variable impedance.

The third impedance setting may constitute a coarse impedance setting for isolating the input node from the output node of the hybrid circuit; and the controller may be further arranged to: iteratively vary the impedance setting starting from the third impedance setting to search for an optimum impedance setting that maximises isolation between the input node and the output node of the hybrid circuit.

The iterative variation of the impedance setting may be an iterative linear variation of the impedance setting.

The apparatus may further comprise an adaptive active signal cancellation subsystem; the active signal cancellation subsystem may be arranged to provide cancellation substantially contemporaneously with the iterative variation of the impedance setting.

The active signal cancellation subsystem may be arranged to adapt iteratively.

The first calibration measurement may be a first transmit-receive gain and the second calibration measurement is a second transmit-receive gain.

According to a second aspect of the present invention, there is provided a wireless communications device comprising the apparatus for duplexing signals as forth above in relation to the first aspect of the invention.

According to a third aspect of the present invention, there is provided a method of duplexing signals to be transmitted wirelessly and signals received wirelessly by an antenna, in a system comprising a hybrid circuit, the hybrid circuit comprising an antenna node for coupling to the antenna, an input node for receiving a signal to be transmitted by the antenna, an output node for outputting a signal received wirelessly by the antenna, a balancing node, a variable impedance coupled to the balancing node, the variable impedance comprising a control input to select an impedance setting of the variable impedance, and a data store comprising a reference of impedance settings and corresponding calibration measurements in respect of a consistent impedance applied to the antenna node of the hybrid circuit, the impedance settings corresponding to impedances, respectively; the method comprising: setting the variable impedance to a first impedance setting; transmitting a first transmit signal at a first transmit frequency in a first frequency band; measuring a first signal at the output node at a first receive frequency in a second frequency band as a result of the first signal transmitted at the first transmit frequency; selecting a second impedance setting; transmit a second transmit signal at a second transmit frequency in the first frequency band; measuring a second signal at the output node at a second receive frequency in the second frequency band as a result of the second signal transmitted at the second transmit frequency; employing a system of equations comprising variables associating the first measured signal, the second measured signal, a first calibration measurement from the record of associations in respect of the first impedance setting, and a second calibration measurement from the record of associations in respect of the second impedance setting; determining a balancing result using the system of equations; retrieving a third impedance setting from the record of associations by reference to the balancing result, the third impedance setting providing isolation of the input node from the output node of the hybrid circuit.

According to a fourth aspect of the present invention, there is provided a computer program code element arranged to execute the method as set forth above in relation to the third aspect of the invention. The computer program code element may be embodied on a computer readable medium.

It is thus possible to provide an apparatus for duplexing signals, a wireless communications device and a method of duplexing signals that enables a hybrid junction to provide improved isolation between input and output nodes thereof. By relating control settings of a variable balancing impedance with calibration measurements, the apparatus, device and method are able to overcome an inaccurate or unknown relationship between control settings of the variable impedance and the actual impedance values that result from the settings. Further optimisations to the apparatus, device and method improve calibration speed during manufacture and reduce memory requirements for storage of calibration data, as well as provide an ability to track small changes to antenna impedances during an active mode of the device so as to maintain isolation between the input and output nodes of the hybrid junction once balance of the hybrid junction has been achieved.

BRIEF DESCRIPTION OF THE DRAWINGS

At least one embodiment of the invention will now be described, by way of example only, with reference to the accompanying drawings, in which.

DETAILED DESCRIPTION

Figure 1:
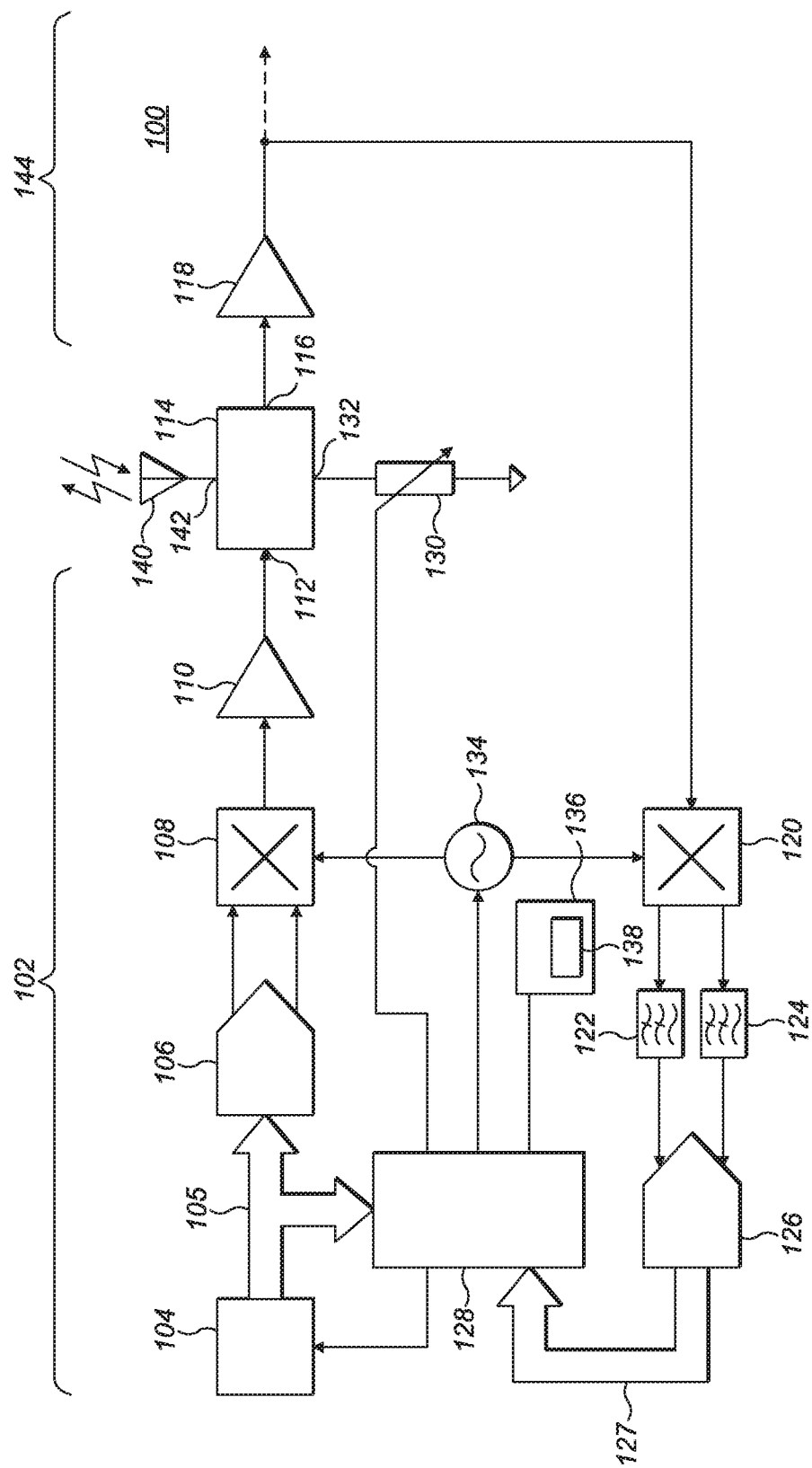
FIG. 1 is a schematic diagram of a device comprising a duplexing apparatus constituting an embodiment of the invention.

Throughout the following description, identical reference numerals will be used to identify like parts. References herein to "ports" should be understood also to refer to "nodes" and vice versa.

Referring to FIG. 1, a wireless communications device 100 employing a duplexing apparatus comprises a transmission path 102, the transmission path 102 comprising a baseband processor 104 coupled to a Digital-to-Analogue converter (DAC) 106 via a first data bus 105. The DAC 106 has an in-phase (I) component output and a quadrature (Q) component output, both coupled to corresponding inputs of a first mixer 108. An output of the first mixer 108 is coupled to an input of a power amplifier 110, an output of the power amplifier 110 being coupled to a transmit port 112 of a hybrid circuit 114, or hybrid junction. A receive port 116 of the hybrid circuit 114 is coupled to an input of a low-noise amplifier 118. An output of the low-noise amplifier 118 is coupled to other downstream components of a receiver chain. As these components of the remainder of the receiver chain would be readily understood by the skilled person and have no bearing on an understanding of the examples set forth herein, they will not be described in further detail herein.

A feedback path is provided that comprises a second mixer 120 having an input coupled to the output of the low-noise amplifier 118. An in-phase component output and a quadrature component output of the second mixer 120 are respectively coupled to a first low-pass filter 122 and a second low-pass filter 124, which are part of the feedback path, the first and second low-pass filters 122, 124 being coupled to respective inputs of an Analogue-to-Digital converter (ADC) 126. An output of the ADC 126, which is also part of the feedback path, is coupled to a first input of a processor 128, for example a microprocessor, via a second data bus 127, a first output of the processor 128 being operably coupled to an input of the baseband processor 104. A second input of the processor 128 is coupled to the first data bus 105.

A second output of the processor 128 is coupled to a control input of a variable impedance 130, the variable impedance 130 being coupled to a balance port 132 of the hybrid circuit 114. A third output of the processor 128 is coupled to an input of a local oscillator 134, a first output of the local oscillator 134 is coupled to the first mixer 108 and a second output of the local oscillator 134 is coupled to the second mixer 120. The processor 128 is also coupled to a memory 136, constituting a data store. In this example, the memory stores reference information, for example a lookup table 138.

An antenna 140 is coupled to an antenna port 142 of the hybrid circuit 114.

In operation, the processor 128 controls the device 100 generally. Indeed, the processor 128 constitutes a processing resource that, in this example, serves as a controller. The processor 128 particularly controls the duplexing operation in a manner described in more detail hereinbelow.

The baseband processor 104 communicates with the processor 128. The processor 128 and/or the baseband processor can have access to the memory 136, which also stores information to be transmitted by the wireless device 100.

The baseband processor 104 generates one or more output signals to be transmitted by the device 100. In this example, as implied above, these signals are digital, and expressed as quadrature (Q) and in-phase (I) components. Those skilled in the art will appreciate that alternative modulation schemes are possible.

The signals output from the baseband processor 104 are input to the DAC 106, and converted to the analogue domain. The signals output from the baseband processor 104 can also be input to the processor 128 to provide any necessary feedback. The analogue signals are up-converted to radio frequency in the mixer 108, by mixing with radio frequency signals generated by the local oscillator 134 under the control of the processor 128, and input to the power amplifier 110 for amplification prior to transmission via the hybrid circuit 114 and the antenna 140.

A receive path 144 of the device 100, in which the low-noise amplifier 118 resides, processes signals received by the antenna 140 via the hybrid circuit 114. The feedback path is provided for the purpose of calibrating the duplexing operation of the hybrid circuit 114, as well as balancing the hybrid circuit 114. In this example, the received signals are tapped off into the feedback path and also output to the remainder of the receive path 144 for subsequent processing. In the feedback path, the received signals are applied to the second mixer 120 from the low-noise amplifier 118 as well as the radio-frequency signals from the local oscillator 134, and downconverted to baseband. In another embodiment, the second mixer 120 can be coupled directly to the output port 116, for example, prior to the low-noise amplifier 118, thereby receiving the signal from the hybrid circuit 114 directly. However, in the present example, the received signals are demodulated into the I and Q components by the second mixer 120, but alternative demodulation schemes will be apparent to those skilled in the art. The I and Q received signals are input respectively to the low-pass filters 122, 124, and further to the ADC 126 to yield digital output signals. The digital output signals are then provided to the processor 128 for processing in a manner to be described below in order to control isolation provided by the hybrid circuit 114.

In this regard, the processor 128 implements a balancing algorithm that strives to maximise isolation of the input port 112 from the output port 116 of the hybrid circuit 114 based upon the following principles.

The transfer function between the input port 112 and output port 116 of the hybrid circuit 114 can be expressed using the following expression:

$$G(\omega, X) = 1/2(\Gamma_A(\omega) - \Gamma_B(\omega, X)) \quad (1)$$

where G is the transmit-receive gain, $\Gamma_A$ is a reflection coefficient of the antenna 140 and $\Gamma_B$ is a reflection coefficient of the balancing impedance 130, ω is frequency, and X is the control parameter for adjusting the balancing impedance 130. In some embodiments, X is a multidimensional variable, for example a vector, representing the multiple tuning dimensions that result from multiple tunable circuit elements.

In previous solutions, maximisation of the isolation was achieved by solving for the following linear simultaneous equations:

$$G_1(\omega, X_1) = P(\omega) + Q(\omega)\Gamma_B(\omega, X_1) \quad (2)$$

$$G_2(\omega, X_2) = P(\omega) + Q(\omega)\Gamma_B(\omega, X_2) \quad (3)$$

where $G_1(\omega, X_1)$ is a first transmit-receive gain, measured for a balancing reflection coefficient of $\Gamma_B(\omega, X_1)$, which results from control value $X_1$, and $G_2(\omega, X_2)$ is a second transmit-receive gain, measured for a balancing reflection coefficient of $\Gamma_B(\omega, X_2)$, which results from control value $X_2$. These equations are based upon the following rewriting of equation (1) above with appropriate substitutions:

$$G(\omega, X) = P(\omega) + Q(\omega)\Gamma_B(\omega, X) \quad (4)$$

and where $G(\omega, X)$ is the transmit-receive gain and $\Gamma_B(\omega, X)$ is the balancing reflection coefficient. $P(\omega)$ is the portion of the transmit-receive gain comprising the coupling path in which signals are reflected at the antenna node 142 of the hybrid circuit 114 due to imperfect matching with the antenna 140. In the case of a perfectly matched antenna, the antenna reflection coefficient is zero and therefore $P(\omega)$ is also zero. $Q(\omega)\Gamma_B(\omega, X)$ is the portion of the transmit-receive gain comprising the coupling path in which signal are reflected at the balancing node 132 of the hybrid circuit 114. $Q(\omega)$ depends on the properties of the hybrid circuit 114 and, as defined above, $\Gamma_B(\omega, X)$ is the reflection coefficient at the balance port 132 as controlled by the variable balancing impedance 130 through the control value X.

It is known that equations (2) and (3) can be solved algebraically to yield an expression for a balancing reflection coefficient that maximises isolation between the input and output ports 112, 116 of the hybrid circuit 114:

$$\Gamma_{BS}(\omega) = \frac{-P(\omega)}{Q(\omega)} = \frac{G_1(\omega)(\Gamma_B(\omega, X_1) - \Gamma_B(\omega, X_2))}{G_2(\omega) - G_1(\omega)} + \Gamma_B(\omega, X_1) \quad (5)$$

Where $\Gamma_{BS}$ is the reflection coefficient value that maximises isolation. Setting the balancing impedance to achieve the reflection coefficient as calculated above will therefore balance the duplexer.

In practice, however, a difference exists between a true balancing impedance provided by the variable impedance 130 and a desired balancing impedance set by way of setting the control input of the variable impedance 130 and known only from the design parameters. With reference to the above example, equation (5) provides the value, $\Gamma_{BS}$, that maximises isolation. However, due to the aforementioned manufacturing imperfections, the required control setting, which may be denoted, $X_{BS}$, and is the setting of the variable impedance to achieve a balancing reflection coefficient, $\Gamma_{BS}$, is not accurately known. Thus, although the desired value, $\Gamma_{BS}$, is known, the apparatus may not apply the correct setting to achieve this value, thereby preventing optimum balancing of the hybrid circuit 114. Furthermore, $\Gamma_B(\omega, X_1)$ and $\Gamma_B(\omega, X_2)$ are inputs to equation (5). However due to the same manufacturing imperfections mentioned above, the provided values for $\Gamma_B(\omega, X_1)$ and $\Gamma_B(\omega, X_2)$ can differ from their desired values. This can introduce error into the calculated value for $\Gamma_{BS}$, thereby also preventing optimum balancing.

These drawbacks are solved by a calibration process that associates the control values of the balancing impedance with measured calibration values that are used by a balancing algorithm. The operation of this is as follows. For the sake of mathematic argument, the function $C(\omega, X)$, which is a linear function of $\Gamma_B(\omega, X)$, is introduced and defined as $$C(\omega, X) = \Delta(\omega)\Gamma_B(\omega, X) + \delta(\omega) \quad (6)$$

By re-arranging equation (6) for $\Gamma_B(\omega, X)$ and substituting into equations (2) and (3) above, the following equations are obtained:

$$G_1(\omega, X_1) = P(\omega) + Q(\omega)\frac{C(\omega, X_1) - \delta(\omega)}{\Delta(\omega)} \quad (7)$$

$$G_2(\omega, X_2) = P(\omega) + Q(\omega)\frac{C(\omega, X_2) - \delta(\omega)}{\Delta(\omega)} \quad (8)$$

The following further substitutions can be employed:

$$P'(\omega) = P(\omega) - Q(\omega)\frac{\delta(\omega)}{\Delta(\omega)} \quad (9)$$

$$Q'(\omega) = \frac{Q(\omega)}{\Delta(\omega)} \quad (10)$$

These expressions can be substituted into equations (7) and (8) to yield the simultaneous equations:

$$G_1(\omega, X_1) = P'(\omega) + Q'(\omega)C(\omega, X_1) \quad (11)$$

$$G_2(\omega, X_2) = P'(\omega) + Q'(\omega)C(\omega, X_2) \quad (12)$$

As this is still a linear system of equations, simultaneous equations (11) and (12) can be solved, as in the case of equations (2) and (3), to balance the hybrid circuit 114. The linear equation (6) is effectively incorporated into the linear system of equations to be solved in order to balance the hybrid circuit 114 without needing to know the factors: $\delta(\omega)$ and $\Delta(\omega)$; knowing simply the values $C(\omega, X_1)$ and $C(\omega, X_2)$ is sufficient and there is no need to know the relationship between these values and $\Gamma_B(\omega, X_1)$ and $\Gamma_{B2}(\omega, X_2)$ respectively.

However, those skilled in the art will recognise that the system of equations (11) and (12) are functions of $C(\omega, X_2)$, and therefore exploiting this system of equations in a like manner to that described above in relation to (2) and (3) yields an expression for $C(\omega)$ (in contrast to an expression for $\Gamma_B(\omega)$). Equation (5) can therefore be re-written as:

$$C_{BS}(\omega) = \frac{-P'(\omega)}{Q'(\omega)} = \frac{G_1(\omega, X_1)(C(\omega, X_1) - C(\omega, X_2))}{G_2(\omega, X_2) - G_1(\omega, X_1)} + C(\omega, X_1) \quad (13)$$

Equation (13) constitutes a system of equations, which can expressly or implicitly comprise one or more equations. Those skilled in the art will appreciate that this calculation is the same calculation as shown in equation (5), but performed in a mapped space where the mapping is given by equation (6). In order to use this equation to determine a setting (X value) for the variable impedance 130, it is necessary to store information concerning the correspondence between settings of the variable impedance 130 and the linear function of the balancing reflection coefficient. With reference to the above example, this correspondence is between X and $C(\omega, X)$.

This is required for two reasons: firstly, to associate the control values $X_1$ and $X_2$ with the values $C(\omega, X_1)$ and $C(\omega, X_2)$, which are inputs to equation (13), and secondly, to associate the calculated value $\Gamma_{BS}(\omega)$ with a corresponding control value, which can be denoted, $X_{BS}$. This control value is that which maximises the transmit-receive isolation of the hybrid circuit 114 when applied to the variable balancing impedance 130.

Figure 2:
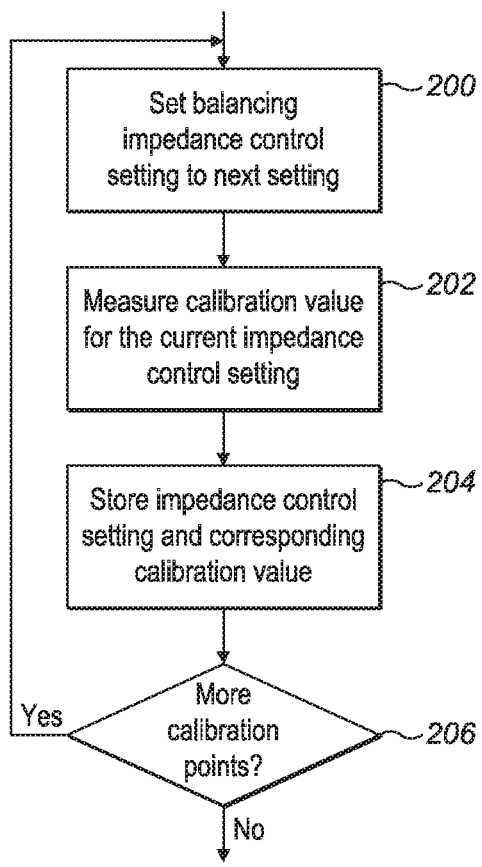
FIG. 2 is a flow diagram of a calibration of the duplexing apparatus of FIG. 1 and constituting another embodiment of the invention.

In this example, and turning to FIG. 2, during production of the wireless device 100 the antenna impedance is maintained at a consistent value, which can be an arbitrary impedance provided that the impedance is consistently applied throughout the calibration process, and then a calibration value or measurement, for example a transmit-receive gain value, can be measured for each setting of the control input of the variable impedance 130. The lookup table 138 is therefore compiled as part of the manufacturing process for the device 100. In this regard, the antenna impedance is set to a predetermined impedance and the predetermined impedance is maintained throughout the calibration process.

The processor 128 then sets (Step 200) the variable impedance 130 to a first setting and then a test signal, for example a pilot signal, is transmitted, and received via the feedback path as a result of any leakage between the input port 112 and the output port 116 of the hybrid circuit 114. The complex transmit signal and the complex received signal, measured via the feedback path, are read from the memory 136 and the associate transmit-receive gain is calculated (Step 202), i.e. the complex self-interference channel is measured. The impedance control setting and the associated transmit-receive gain value are then stored (Step 204) in the lookup table 138. The processor 128 then establishes (Step 206) whether further settings of the variable impedance 130 need to be set in order to determine the transmit-receive gain value for each setting of the variable impedance 130. In this respect, the variable impedance 130 comprises a set of selectable settings, constituting a plurality of impedance settings, which covers all possible impedances to which the variable impedance can be set to provide. If, in this example, all settings of the variable impedance have not been set and the associated transmit-receive gain determined, then the processor 128 continues to iterate through the impedance settings of the variable impedance 130 that have not yet been set, and make corresponding measurements (Steps 200 to 206). Once it has been determined (Step 206) that all the impedance settings have been set and their associated transmit-receive gains have been determined, the processor 128 terminates the calibration process, because it has been completed.

As a result of the calibration process, the lookup table 138 comprises digital settings for the variable impedance 130 and associated transmit-receive gain values. The lookup table 138 is used in conjunction with equation (13) above in the following manner in order to determine the variable impedance that results in maximising isolation between the input and output ports 112, 116 of the hybrid circuit 114. This equation constitutes a system of equations that associates a first measured signal, a second measured signal, a first transmit-receive gain from the lookup table 138 in respect of a first impedance setting, and a second transmit-receive gain from the lookup table 138 in respect of a second impedance setting. The system of equations also effectively associates signals transmitted in order to measure the first and second transmit-receive gains.

In this embodiment the calibration values measured and stored by the calibration process are complex transmit-receive gain values. However, in other embodiments the calibration values can be processed transmit-receive gains, or received signal values, received in respect of consistent transmit signal values, or otherwise processed receive signal values. Those skilled in the art should appreciate that, since the calibration values need only be a consistent linear function of the balancing reflection coefficient values as shown above, numerous parameters exist that satisfy this criterion, for example the transmit-receive gain values multiplied or divided by a consistent value.

Figure 3:
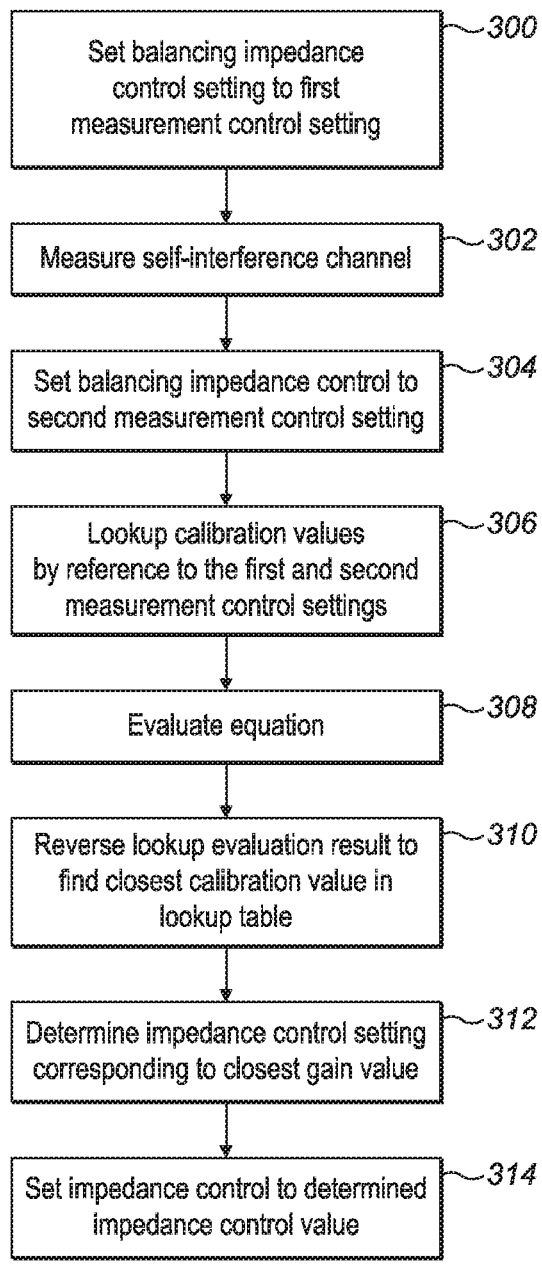
FIG. 3 is a flow diagram of a method of duplexing in the duplexing apparatus of FIG. 1 and constituting a further embodiment of the invention.

Referring to FIG. 3, as part of supporting operation of the device 100, the processor 128 controls the hybrid circuit 114 in order to isolate the input port 112 from the output port 116.

The processor 128 controls (Step 300) the variable impedance 130 to take a particular first impedance setting, $X_1$. The corresponding impedance, denoted, $Z_1$, can be, for example, approximately 50 ohms, although it should be appreciated that the impedance can be arbitrarily set and indeed the value is unimportant as the method operates in terms of impedance settings. The processor 128 also controls the local oscillator 134 to oscillate at a frequency such that signals are transmitted via the antenna 140 at a first transmit frequency, $\omega_1$, within a first frequency band of interest. The frequency band of interest can be a transmit band, for example.

A signal is then transmitted at the frequency, $\omega$, via the power amplifier 110, the hybrid circuit 114 and the antenna 140. As this happens, the signal arising at the receive node 116 (owing to imperfect isolation by the hybrid circuit 114) at a first receive frequency is measured (Step 302) using the feedback path described above. The first measured signal is stored, for example, in the memory 136. The measurement of the received signal takes place over a second frequency band of interest, which can be a receive band, for example. The first transmit frequency and the first receive frequency can be identical or different. The first and second frequency bands of interest can be entirely different, i.e. they do not overlap at all, or can overlap partially. In one embodiment, the first and second frequency bands of interest can overlap entirely, i.e. one band falls entirely within the other band, or be identical. In the latter case, the device 100 can be described as operating in an "in-band full duplex" mode.

After the first measured signal has been stored, the processor 128 changes (Step 304) the variable impedance 130 to a second, different, known impedance setting $X_2$, corresponding to a second impedance $Z_2$, and instructs the baseband processor 104 to generate another signal. The processor 128 controls the local oscillator 134 to oscillate at a second transmit frequency in the first frequency band of interest. The second signal arising at the receive node 116 is measured (Step 306) at a second receive frequency in the second frequency band of interest using the feedback path described above. The second measured signal is stored, for example, in the memory 136.

Once that the measurements have been made and stored in respect of the first and second impedance settings, $X_1$, $X_2$ (Steps 300 to 306), the processor 128 accesses the memory 136 and looks up the transmit-receive gain values in respect of the first and second impedance settings, $X_1$, $X_2$, used. Thereafter, using the stored measured first and second received signals, and the retrieved looked-up transmit-receive gain values, the processor 128 calculates first and second transmit-receive gains using first and second transmit signal data and the measured first and second received signals, and evaluates (Step 308) equation (13) to obtain a balancing result, for example a calculated gain value, constituting a third gain, corresponding to maximum isolation of the input and output ports 112, 116 of the hybrid circuit 114. The processor 128 then, using the calculated gain value (Step 310) reverse looks-up the calculated gain value in order to identify (Step 312) a third impedance setting in the lookup table 138 having a corresponding transmit-receive gain that is closest to the calculated gain value. The impedance setting identified is then retrieved and the processor 128 sets (Step 314) the control input of the variable impedance 130 to the retrieved setting, thereby maximising isolation between the input and output nodes 112, 116 of the hybrid circuit 114. As such, the variable impedance 130 is controlled as a function of the retrieved first and second gains and the first and second measured gains. This setting of the third impedance can be performed periodically while, for example, the device 100 is in an active state/mode.

In this embodiment, the measurement values that are used in the balancing equation (13), which are denoted $G_1(\omega, X_1)$ and $G_2(\omega, X_2)$ above, are transmit-receive gain values. However, those skilled in the art will appreciate that there exist alternative measurement values that can be used. For example, if the measured gain values are, for example, multiplied or divided by a consistent quantity, the value of equation (13) is unchanged. Consequently, other embodiments exist that use other measurement values in the balancing equation, for example, using processed gain values, or received signal values received in respect of consistent transmit signal values, or otherwise processed receive signal values. Those skilled in the art will recognise that the measurement values as used in the equations need only be linearly proportional to the transmit-receive gain, and a number of parameters exist that can satisfy this criterion.

In this example, the impedance control is discrete and has a finite number of impedance control states. In another embodiment, the impedance control may be continuous. Those skill in the art will appreciate that in the case of a continuous impedance control, other possibilities exist for the calibration process, for example, making calibration measurements at a set of discrete impedance control points within the continuous control domain.

In this example, the record of associations is a discrete set of associations between impedance settings and calibration values or measurements. In other embodiments, the record of associations could alternatively comprise an equation, or piecewise function, or otherwise, which serves to relate the impedance settings and calibration values.

Figure 4:
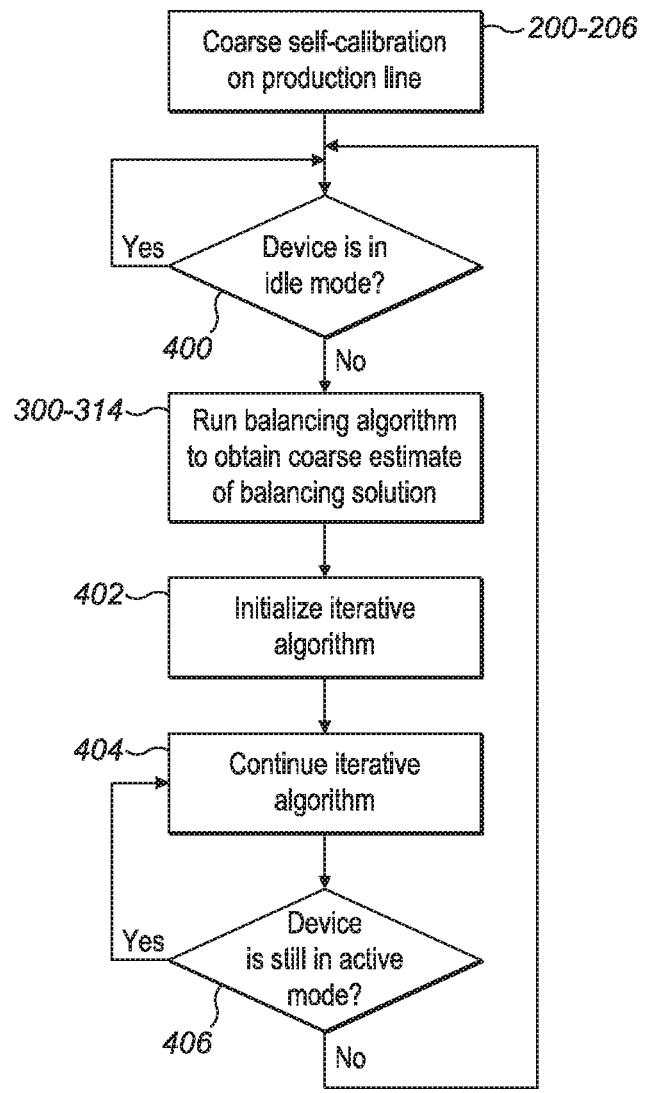
FIG. 4 is a flow diagram of another method of duplexing in the duplexing apparatus of FIG. 1 and constituting yet another embodiment of the invention.

In another embodiment (FIG. 4), the variable impedance 130 has a set of possible settings and a number of the set of possible impedance settings, for example a subset of the possible settings, is selected for the performance of the calibration process (Steps 200 to 206) described above. The subset of the possible settings can constitute the plurality of settings. In this example, the subset of possible impedance settings is between about 100 impedance settings and about 1000 impedance settings. In this regard, instead of iterating through all the possible impedance settings that can be set for the variable impedance 130, the processor 128 implements the method of FIG. 2 in respect of a subset of impedance settings. This results in the lookup table 138 stored in the memory 136 comprising a reduced number of entries associating impedance settings with respective measured transmit-receive gains using a constant antenna impedance, the calibration process thereby constituting a coarse calibration.

Consequently, given the coarser quality of the lookup table 138 as compared with a lookup table generated using substantially all impedance settings of the variable impedance 130, the processor 128 needs to compensate for the coarse quality of the lookup table 138 in order to achieve optimum isolation between the input node 112 and the output node 116 of the hybrid junction 114.

The processor 128 determines (Step 400) whether the device 100 is in an idle mode. When the device is not in an idle mode, the processor 128 implements the balancing method (FIG. 3: Steps 300 to 314) in order to obtain a coarse estimate of the balancing impedance setting, constituting the third impedance setting, given the coarse nature of the lookup table 138. Thereafter, the processor 128 initiates (Step 402) an iterative algorithm in order to, for example, search for an improved balancing impedance setting as compared with the coarse third impedance setting determined as a result of evaluating equation (13) and performing a reverse lookup using the lookup table 138. In this example, the iterative algorithm comprises performing a line search, i.e. an iterative linear variation, in respect of the third impedance setting. The third impedance setting is varied according to the search algorithm in order to improve on the third impedance setting, thereby improving isolation between the input node 112 and the output node 116 of the hybrid junction 114.

Figure 5:
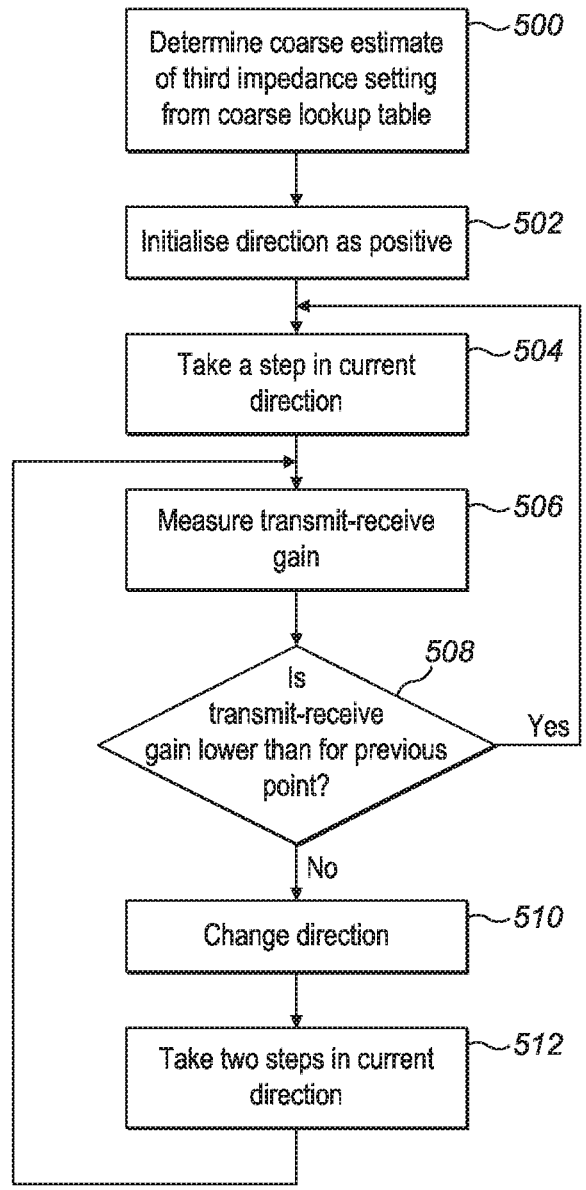
FIG. 5 is a flow diagram of an iterative algorithm of FIG. 4 in greater detail.

In this respect, and referring to FIG. 5, the third coarse impedance setting is determined (Step 500) as mentioned above and the direction of the search is set (Step 502) as positive. The processor 128 then continues to implement the iterative algorithm to refine the coarse third impedance setting determined by modifying (Step 504) the coarse third impedance setting to a neighbouring setting in the direction set. The processor 128 then measures (Step 506) the transmit-receive gain, followed by a determination (Step 508) as to whether the impedance setting used results in an improvement to the isolation between the input node 112 and the output node 116 of the hybrid junction 114. In the event that improved isolation has resulted, the algorithm iterates in order to continue adjusting the impedance setting in the direction selection (Steps 504 to 508). In the event that the change in impedance setting has not resulted in improved isolation between the input node 112 and the output node 116 of the hybrid junction 114, the processor 128 changes (Step 510) the direction of the search and then adjusts (Step 512) the impedance setting of the variable impedance 130 by two sequential neighbouring settings in the new direction. Thereafter, the processor 128 measures (Step 506) the transmit-receive gain resulting from the changed impedance setting of the variable impedance 130 in order to determine whether isolation has improved (Step 508). Referring back to FIG. 4, the above iterative loop continues (Step 404) until adjustment of the impedance settings is no longer required (Step 406), for example when the device 100 ceases to be in the active mode.

With reference to the above-described example, the skilled person should appreciate that although searching in a single dimension has been described for the sake of conciseness and clarity of description, the search can be performed in respect of a greater number of dimensions, for example two or more dimensions, such as resistance and capacitance settings. For example, in another embodiment, the tunable impedance 130 comprises multiple tunable circuit elements. In such an embodiment, the iterative optimisation can be multidimensional. This multidimensional optimisation can, for example, comprise the steps of FIG. 5, applied to each circuit element sequentially or, for example, comprise the steps of FIG. 5, applied to each circuit element concurrently.

Those skilled in the art will appreciate that there are numerous well-known iterative optimisation methods that can be employed as an alternative to the steps described above in relation to FIG. 5. Additionally, those skilled in the art will also appreciate that any suitable interpolation technique can be employed in relation to the coarse record of associations between the impedance settings and calibration measurements, as an alternative to, or as a preliminary step to, an iterative optimisation.

Figure 6:
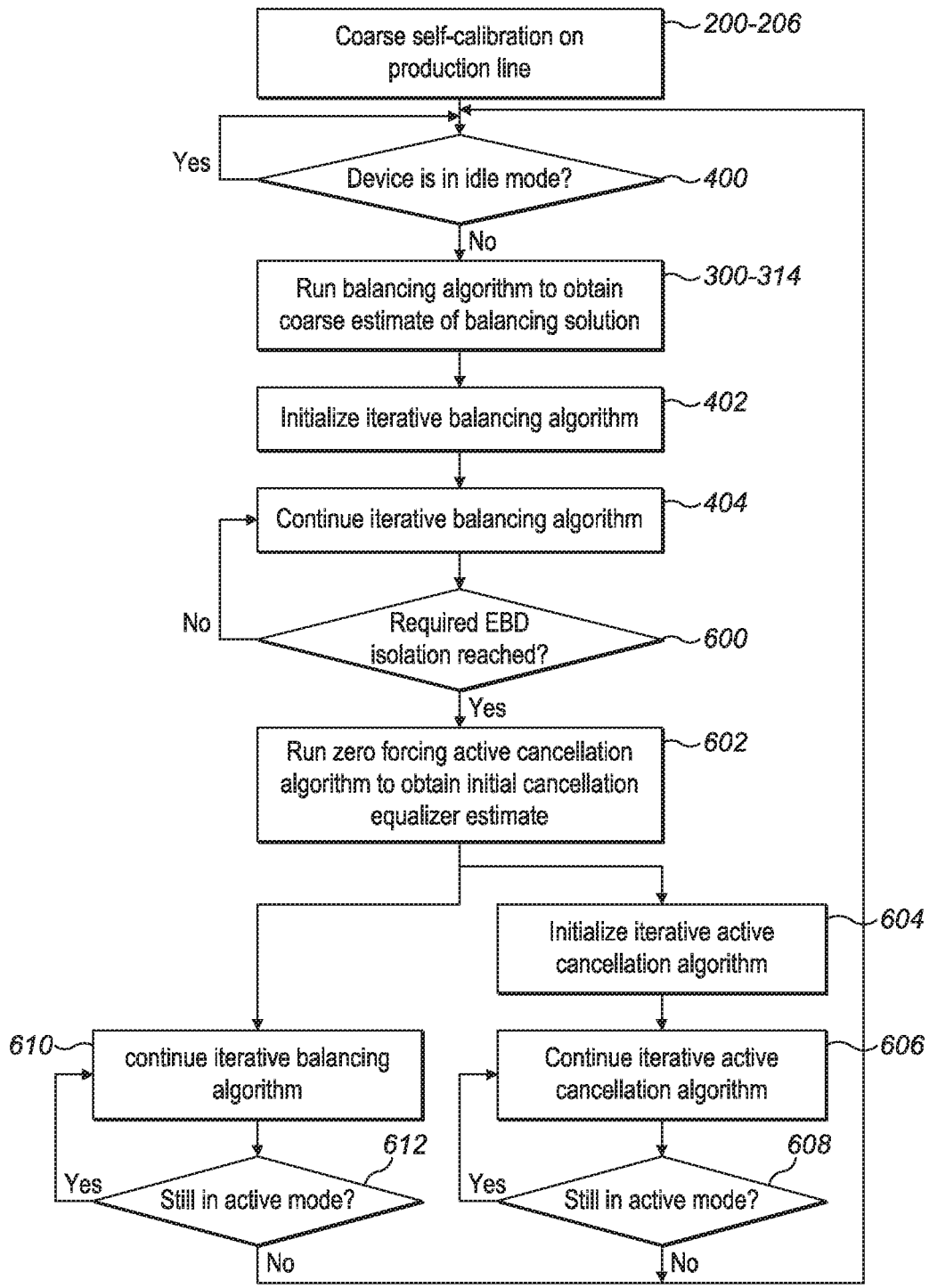
FIG. 6 is a flow diagram of a further method of duplexing in the duplexing apparatus of FIG. 1, as modified by the apparatus of FIG. 7 below, and constituting another embodiment of the invention.

In a further embodiment (FIG. 6), an active cancellation technique can be implemented in conjunction with the use of an iterative setting adjustment algorithm when using the coarse lookup table described above. Of course, it should be appreciated that a higher resolution calibration can be employed instead of the coarse calibration and without the iterative setting adjustment algorithm. In any event, in this example, the production line based coarse self-calibration is performed (Steps 200 to 206) in the manner already described above. Similarly, as already described above, the processor 128 determines (Step 400) whether the device 100 is in an idle mode and if the device 100 is not in an idle mode, the processor 128 implements the balancing method (Steps 300 to 314) in order to obtain a coarse estimate of the balancing impedance, constituting the third impedance, given the coarse nature of the lookup table 138. Thereafter, the processor 128 initiates (Step 402) the iterative algorithm described above in order to, for example, search for an improved balancing impedance as compared with the coarse third impedance setting determined as a result of evaluating equation (13) and performing a reverse lookup using the coarse lookup table 138. In this example, the iterative algorithm comprises performing a line search in respect of the third impedance setting. The third impedance setting is varied according to the search algorithm in order to improve on the third impedance setting, thereby achieving (Step 600) a required improved isolation between the input node 112 and the output node 116 of the hybrid junction 114. Thereafter, a zero forcing cancellation algorithm is implemented (Step 602) in order to obtain initial equalizer estimates, details of which will now be described.

Figure 7:
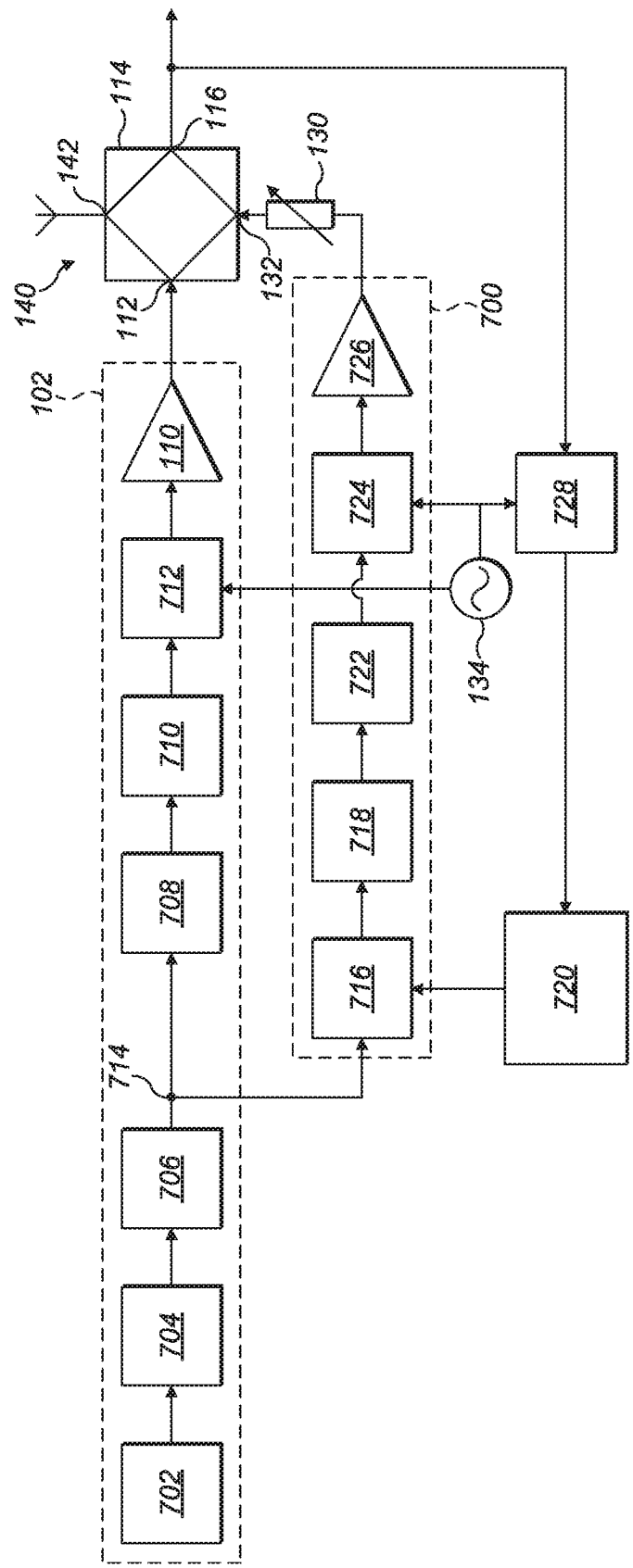
FIG. 7 is the additional part of the duplexing apparatus of FIG. 1 used in relation to the further method of FIG. 6.

In this example, and referring to FIG. 7, in addition to the transmission path 102, the device 100 comprises an active cancellation subsystem comprising an auxiliary transmission path 700. For a Single-Carrier Frequency Division Multiple Access waveform specified for the LTE communications system, the baseband processor 104 of FIG. 1 supports a data mapper 702 (FIG. 7) operably coupled to a waveform generator 704. The waveform generator 704 is operably coupled to a digital Fourier transform unit 706, the digital Fourier transform unit 706 being an M-point digital transform unit. A subcarrier mapping unit 708 is operably coupled to the digital Fourier transform unit 706 and an N-point inverse fast Fourier transform unit 710, where N is greater than M. The inverse Fourier transform unit 710 is operably coupled to an up-converter 712, which has an output that is operably coupled to the input of the power amplifier 110. The up-converter 712 comprises the DAC 106 and the mixer 108 of FIG. 1.

In this example, a signal in the transmission path 102 is, when in use, tapped by way of copying. In this respect, a tapping point 714 is located at the output of the digital Fourier transform unit 706 and is coupled to the auxiliary transmission path 700 of the device 100, the auxiliary transmission path 700 comprising transmitter chain processing stage units, for example a Frequency Domain Equaliser (FDE) 716 (for which initial equaliser estimates are mentioned above) having an input thereof coupled to the tapping point 714 and an output operably coupled to an input of an auxiliary subcarrier mapping unit 718. In the examples set forth herein, the input of the frequency domain equalizer 716 is a set of M Fourier components representing the symbol signal being transmitted. A "leakage channel" between the input node 112 and the output node 116 of the hybrid junction 114, and a "cancellation channel" between the balance node 132 and the output node 116, are estimated by an adaptation signal processor 720. These channel estimates are used to determine coefficients for the FDE 716. The FDE 716 can be implemented as a complex coefficient vector representing a frequency domain transfer function, for example a set of M complex coefficients that encode the amplitude and phase of the frequency domain transfer function at each of the M frequencies of the Fourier components of the tapped signal. The frequency domain equaliser 716 serves to perform, when in use, a point-by-point multiplication of each Fourier component of the tapped signal with the corresponding complex FDE coefficient mentioned above in order to generate M modified Fourier components that can be input to the auxiliary subcarrier mapping unit 718.

An output of the auxiliary subcarrier mapping unit 718 is operably coupled to an input of an auxiliary N-point inverse fast Fourier transform unit 722, an output of which is operably coupled to an input of an auxiliary up-converter 724. An output of the auxiliary up-converter 724 is operably coupled to an input of an auxiliary power amplifier 726. An output of the auxiliary power amplifier 726 is coupled to the balance node 132 of the hybrid junction 114 via a variable impedance matching network 130. In this example, the adaptation signal processor 720 constituting a coefficient processor is operably coupled to the frequency domain equaliser 716 and together they serve as an adaptive filter unit. The adaptation signal processor 720 is also operably coupled to a monitoring output of a signal monitoring unit 728. The local oscillator 134 is operably coupled to the up-converter 712, the auxiliary up-converter 724 and the signal monitoring unit 728. This architecture is an active cancellation architecture as described in International patent publication no. PCT/EP2015/052800, the contents of which are incorporated herein by reference in their entirety. Other architectures can also be implemented to provide active cancellation, some of which are also described in PCT/EP2015/052800.

In another embodiment, the channel estimation and equalisation signal processing could alternatively be performed in the time domain using any suitable techniques.

In operation, the auxiliary transmission path 700 serves to generate an isolation signal to cancel a transmission signal leaked by the hybrid junction 114 between the input node 112 and the output node 116 thereof. As the detail of the generation of the isolation signal is not central to an understanding of this embodiment, for the sake of conciseness and clarity of description, the detail that can be found in PCT/EP2015/052800 will not be reproduced herein.

Referring back to FIG. 6, after obtaining the initial equaliser estimate (Step 602) as mentioned above, the adaptation signal processor 720, in cooperation with the auxiliary transmission path 700, initialises (Step 604) the active cancellation algorithm that the adaptation signal processor 720 implements, and the active cancellation algorithm is executed (Step 606) in order to generate the isolation signal that is applied to the balance node 132. The isolation signal is generated, albeit continually adapting, while the device 100 is determined (Step 608) to be in the active mode.

Substantially contemporaneously, for example in parallel, the processor 128 implement (Step 610) the iterative balancing algorithm described above (Steps 402, 404, 600) while the device 100 is determined (Step 612) to be in the active mode. The dual execution of the iterative search algorithm and the active cancellation algorithm serves to maintain maximum isolation between the input node 112 and the output node 116 of the hybrid junction 114.

The exemplary embodiments of the invention set forth above are considered to be illustrative and not limiting. Various changes to the described embodiments may be made without departing from the spirit and scope of the invention.

The skilled person should appreciate that the above-described implementations are merely examples of the various implementations that are conceivable within the scope of the appended claims. Indeed, throughout the above description, reference has been made to the lookup table 138 and discrete digital settings of the variable impedance 130. In this regard, the skilled person should understand that the variable impedance can be a continuously variable, for example analogue, variable impedance. Instead of the lookup table 138, the memory 136 can contain an alternative kind of reference, for example an equation that represents the relationship between the impedance settings of the variable impedance 130 and the transmit-receive gains associated with the respective impedance settings. Alternatively, the memory 136 can store a piecewise approximation associating the transmit-receive gains with the respective continuous control inputs of the variable impedance 130. As a further alternative, the memory 136 can implement a lookup table or other record of a discrete plurality of associations between the transmit-receive gains and the respective continuous control settings of the variable impedance 130.

In relation to the hybrid junction 114 described herein, the skilled person should appreciate that any suitable construction can be employed. For example, in the above embodiment a transformer hybrid junction has been described. In another embodiment, a quadrature hybrid junction has been employed, although other variants, for example a 180° transformer hybrid junction, could be used. Other suitable kinds of hybrid junction can also be employed, for example a waveguide hybrid junction.

The systems and methods of the above embodiments may be implemented in a computer system (in particular in computer hardware or in computer software) or in specifically manufactured or adapted integrated circuits, in addition to the structural components and user interactions described. The methods of the above embodiments may be provided as computer programs or as computer program products or computer readable media carrying a computer program which is arranged, when run on a computer or other processor, to perform the method(s) described above.

The term "computer readable media" includes, without limitation, any medium or media which can be read and accessed directly by a computer or computer system. The media can include, but are not limited to, magnetic storage media such as floppy discs, hard disc storage media and magnetic tape; optical storage media such as optical discs or CD-ROMs; electrical storage media such as memory, including RAM, ROM and flash memory; and hybrids and combinations of the above such as magnetic/optical storage media.

What is claimed is:

1. An apparatus for duplexing signals to be transmitted and received wirelessly by an antenna, the apparatus comprising:

a hybrid circuit comprising an antenna node for coupling to the antenna, an input node for receiving a signal to be transmitted wirelessly by the antenna, an output node for outputting a signal received wirelessly by the antenna, and a balancing node;

a variable impedance operably coupled to the balancing node, the variable impedance comprising a control input to select an impedance setting of the variable impedance;

a data store comprising a reference of impedance settings and corresponding calibration measurements in respect of a consistent impedance applied to the antenna node of the hybrid circuit, the impedance settings corresponding to impedances; and a controller arranged to:
set the variable impedance to a first impedance setting;
transmit a first transmit signal at a first transmit frequency in a first frequency band;
measure a first signal at the output node at a first receive frequency in a second frequency band as a result of the first signal transmitted at the first transmit frequency;
select a second impedance setting;
transmit a second transmit signal at a second transmit frequency in the first frequency band;
measure a second signal at the output node at a second receive frequency in the second frequency band as a result of the second signal transmitted at the second transmit frequency;
employ a system of equations comprising variables associating the first measured signal, the second measured signal, a first calibration measurement from the record of associations in respect of the first impedance setting, and a second calibration measurement from the record of associations in respect of the second impedance setting;
determine a balancing result using the system of equations; and
retrieve a third impedance setting from the record of associations by reference to the balancing result, the third impedance setting providing isolation of the input node from the output node of the hybrid circuit.

2. The apparatus of claim 1, wherein the reference of impedance settings and corresponding calibration measurements is a record of associations between a plurality of impedance settings and a plurality of respective calibration measurements in respect of the consistent impedance applied to the antenna node, the plurality of impedance settings corresponding to a plurality of impedances, respectively.

3. The apparatus of claim 1, wherein the control input of the variable impedance is continuously variable or discrete.

4. The apparatus of claim 1, wherein the reference comprises an equation recording the relationship between the calibration measurements and the impedance settings.

5. The apparatus of claim 1, wherein the controller is further arranged to:
vary the impedance value using the control input to provide the plurality of impedance settings and to generate a record of associations between the plurality of impedance settings and a plurality of respective calibration measurements.

6. The apparatus of claim 1, wherein the control input of the variable impedance comprises a set of selectable settings, the plurality of impedance settings respectively corresponding to a number of the set of possible settings of the variable impedance.

7. The apparatus of claim 6, wherein the plurality of impedance settings respectively corresponds to the set of selectable settings of the variable impedance.

8. The apparatus of claim 6, wherein the number of the set of selectable settings of the variable impedance is a subset of the set of selectable settings of the variable impedance.

9. The apparatus of claim 8, wherein the subset of the set of selectable settings of the variable impedance comprises between about 100 and about 1000 variable impedance setting of the selectable settings of the variable impedance.

10. The apparatus of claim 1, wherein the controller is further arranged to:
for each measurement of the first and second signals, calculate respective quantities representing a first measured gain and a second measured gain;
access the data store and retrieve the first calibration measurement and the second calibration measurement from the record of associations by reference to the first and second impedance settings, respectively; and
control the variable impedance as a function of the respective quantities and the retrieved first and second transmit-receive gains.

11. The apparatus of claim 1, wherein the controller is configured to carry out operations periodically to determine the third impedance setting.

12. The apparatus of claim 1, wherein the controller is arranged to evaluate:

$$\frac{G_1(\omega, X_1)(C(\omega, X_1) - C(\omega, X_2))}{G_2(\omega, X_2) - G_1(\omega, X_1)} + C(\omega, X_1)$$

to obtain the third balancing result, where $G_1$ is a first measured transmit-receive gain, $G_2$ is a second measured transmit-receive gain, C is the calibration measurement, $X_1$ is the first impedance setting, $X_2$ is the second impedance setting, and $\omega$ is frequency.

13. The apparatus of claim 1, wherein the system of equations employed comprises variables associating the first measured signal, the second measured signal, the first impedance setting, the second impedance setting, the first transmitted signal, the second transmitted signal, a first calibration measurement and a second calibration measurement.

14. The apparatus of claim 1, wherein the system of equations models a transmit-receive gain variable as a function of a calibration measurement variable that can be related to the impedance setting of the variable impedance.

15. The apparatus of claim 6, wherein:
the third impedance setting constitutes a coarse impedance setting for isolating the input node from the output node of the hybrid circuit, and
the controller is further arranged to:
iteratively vary the impedance setting starting from the third impedance setting to search for an optimum impedance setting that maximises isolation between the input node and the output node of the hybrid circuit.

16. The apparatus as claimed in claim 15, wherein the iterative variation of the impedance setting is an iterative linear variation of the impedance setting.

17. The apparatus of claim 15, further comprising:
an adaptive active signal cancellation subsystem configured to provide cancellation substantially contemporaneously with the iterative variation of the impedance setting.

18. The apparatus of claim 1, wherein the first calibration measurement is a first transmit-receive gain and the second calibration measurement is a second transmit-receive gain.

19. A method of duplexing signals to be transmitted wirelessly and signals received wirelessly by an antenna in a system comprising a hybrid circuit including an antenna node for coupling to the antenna, an input node for receiving a signal to be transmitted by the antenna, an output node for outputting a signal received wirelessly by the antenna, a balancing node, a variable impedance coupled to the balancing node, the variable impedance comprising a control input to select an impedance setting of the variable impedance, and a data store comprising a reference of impedance settings and corresponding calibration measurements in respect of a consistent impedance applied to the antenna node of the hybrid circuit, the impedance settings corresponding to impedances, respectively, the method comprising:

- setting the variable impedance to a first impedance setting;
- transmitting a first transmit signal at a first transmit frequency in a first frequency band;
- measuring a first signal at the output node at a first receive frequency in a second frequency band as a result of the first signal transmitted at the first transmit frequency;
- selecting a second impedance setting;
- transmit a second transmit signal at a second transmit frequency in the first frequency band;
- measuring a second signal at the output node at a second receive frequency in the second frequency band as a result of the second signal transmitted at the second transmit frequency;
- employing a system of equations comprising variables associating the first measured signal, the second measured signal, a first calibration measurement from the record of associations in respect of the first impedance setting, and a second calibration measurement from the record of associations in respect of the second impedance setting;
- determining a balancing result using the system of equations; and
- retrieving a third impedance setting from the record of associations by reference to the balancing result, the third impedance setting providing isolation of the input node from the output node of the hybrid circuit.

20. A non-transitory processor-readable medium storing instructions that are executable by one or more processors of an apparatus to perform a method for duplexing signals to be transmitted wirelessly and signals received wirelessly by an antenna in a system comprising a hybrid circuit including an antenna node for coupling to the antenna, an input node for receiving a signal to be transmitted by the antenna, an output node for outputting a signal received wirelessly by the antenna, a balancing node, a variable impedance coupled to the balancing node, the variable impedance comprising a control input to select an impedance setting of the variable impedance, and a data store comprising a reference of impedance settings and corresponding calibration measurements in respect of a consistent impedance applied to the antenna node of the hybrid circuit, the impedance settings corresponding to impedances, respectively the method comprising:

- setting the variable impedance to a first impedance setting;
- transmitting a first transmit signal at a first transmit frequency in a first frequency band;
- measuring a first signal at the output node at a first receive frequency in a second frequency band as a result of the first signal transmitted at the first transmit frequency;
- selecting a second impedance setting;
- transmit a second transmit signal at a second transmit frequency in the first frequency band;
- measuring a second signal at the output node at a second receive frequency in the second frequency band as a result of the second signal transmitted at the second transmit frequency;
- employing a system of equations comprising variables associating the first measured signal, the second measured signal, a first calibration measurement from the record of associations in respect of the first impedance setting, and a second calibration measurement from the record of associations in respect of the second impedance setting;
- determining a balancing result using the system of equations; and
- retrieving a third impedance setting from the record of associations by reference to the balancing result, the third impedance setting providing isolation of the input node from the output node of the hybrid circuit.

* * * * *

UNITED STATES PATENT AND TRADEMARK OFFICE
CERTIFICATE OF CORRECTION

PATENT NO. : 10,680,724 B2  
APPLICATION NO. : 16/262812  
DATED : June 9, 2020  
INVENTOR(S) : Leo Laughlin Page 1 of 1

It is certified that error appears in the above-identified patent and that said Letters Patent is hereby corrected as shown below:

On the Title Page

Item (30), under "Foreign Application Priority Data," "18154556" should read --18154556.7--.

Signed and Sealed this
Fourteenth Day of July, 2020

Andrei Iancu
*Director of the United States Patent and Trademark Office*